United States Patent
Sankin et al.

(10) Patent No.: US 7,977,713 B2
(45) Date of Patent: Jul. 12, 2011

(54) SEMICONDUCTOR DEVICES WITH NON-PUNCH-THROUGH SEMICONDUCTOR CHANNELS HAVING ENHANCED CONDUCTION AND METHODS OF MAKING

(75) Inventors: Igor Sankin, Starkville, MS (US); David C. Sheridan, Starkville, MS (US); Joseph Neil Merrett, Starkville, MS (US)

(73) Assignee: Semisouth Laboratories, Inc., Starkville, MS (US)

( * ) Notice: Subject to any disclaimer, the term of this patent is extended or adjusted under 35 U.S.C. 154(b) by 256 days.

(21) Appl. No.: 12/117,121

(22) Filed: May 8, 2008

(65) Prior Publication Data

US 2009/0278177 A1 Nov. 12, 2009

(51) Int. Cl.
*H01L 29/772* (2006.01)

(52) U.S. Cl. ........... 257/263; 257/77; 257/E29.104; 257/E29.242

(58) Field of Classification Search .......... 257/77, 257/263, E29.104, E29.242; 438/192
See application file for complete search history.

(56) References Cited

U.S. PATENT DOCUMENTS

| | | | |
|---|---|---|---|
| 2,984,752 A | | 5/1961 | Giacoletto |
| 4,216,490 A | | 8/1980 | Ohki |
| 4,364,072 A | | 12/1982 | Nishizawa |
| 4,403,396 A | | 9/1983 | Stein |
| 4,587,540 A | * | 5/1986 | Jackson ............... 257/263 |
| 5,429,956 A | | 7/1995 | Shell et al. |
| 5,747,831 A | | 5/1998 | Loose et al. |
| 5,753,938 A | * | 5/1998 | Thapar et al. ........... 257/77 |
| 5,945,701 A | | 8/1999 | Siergiej et al. |
| 6,096,607 A | * | 8/2000 | Ueno .................... 438/268 |
| 6,444,527 B1 | | 9/2002 | Floyd et al. |
| 6,870,189 B1 | * | 3/2005 | Harada et al. ............ 257/77 |
| 6,917,054 B2 | * | 7/2005 | Onose et al. ............. 257/77 |
| 7,173,284 B2 | * | 2/2007 | Kumar et al. ............ 257/77 |
| 7,187,021 B2 | * | 3/2007 | Mitra et al. ............. 257/264 |
| 7,763,506 B2 | * | 7/2010 | Treu et al. ............... 438/192 |
| 2005/0181536 A1 | * | 8/2005 | Tsuji ..................... 438/105 |
| 2006/0226504 A1 | * | 10/2006 | Hatakeyama et al. .... 257/472 |
| 2007/0096145 A1 | * | 5/2007 | Watanabe ............... 257/134 |
| 2007/0187715 A1 | | 8/2007 | Zhao |
| 2007/0278540 A1 | * | 12/2007 | Hoshino et al. ......... 257/263 |
| 2008/0280412 A1 | * | 11/2008 | Tsuji ..................... 438/285 |
| 2010/0148224 A1 | * | 6/2010 | Zhao .................... 257/263 |

OTHER PUBLICATIONS

J.N. Merrett, et al., "RF and DC Characterization of Self-aligned L-band 4H-SiC Static Induction Transistors," Materials Science Forum, vols. 527-529, 2006, pp. 1223-1226.

J.H. Zhao, et al., "3.6 mΩ•cm2, 1726V 4H-SiC normally-off trenched-and-implanted vertical JFETs and circuit applications," IEE Proc.-Circuits Devices Syst., vol. 151, No. 3, Jun. 2004.

P. Sannuti, et al., "Channel electron mobility in 4H-SiC lateral junction field effect transistors," Solid-State Electronics, 49, 2005, pp. 1900-1904.

(Continued)

*Primary Examiner* — Allan R Wilson
(74) *Attorney, Agent, or Firm* — Morris, Manning & Martin, LLP; Christopher W. Raimund

(57) ABSTRACT

Semiconductor devices are described wherein current flow in the device is confined between the rectifying junctions (e.g., p-n junctions or metal-semiconductor junctions). The device provides non-punch-through behavior and enhanced current conduction capability. The devices can be power semiconductor devices as such as Junction Field-Effect Transistors (VJFETs), Static Induction Transistors (SITs), Junction Field Effect Thyristors, or JFET current limiters. The devices can be made in wide bandgap semiconductors such as silicon carbide (SiC). According to some embodiments, the device can be a normally-off SiC vertical junction field effect transistor. Methods of making the devices and circuits comprising the devices are also described.

24 Claims, 7 Drawing Sheets

OTHER PUBLICATIONS

W. Shockley, "A Unipolar "Field-Effect" Transistor," Proceedings of the IRE, vol. 40, Issue 11, Nov. 1952, pp. 1365-1376.

I. Sankin, "Edge termination and RESURF technology in power silicon carbide devices," Ph.D. Dissertation, Mississippi State University, 2006, AAT 3213969, pp. 106-111.

M. Nagata, et al., "A short-channel, punch-through-breakdown-free MOS transistor," International Electron Devices Meeting, vol. 17, 1971, pp. 2-3.

Legacy CACE User's Guide AixRecipe, Recipe Language for AIXTRON systems, Copyright 1994-2004, AIXTRON AG, Kaskertstrasse 15-17 D-52072 Aashen, Germany.

I. Sankin, et al., "Power SiC MOSFETs," Advances in Silicon Carbide Processing and Applications, Book Chapter, S. E. Saddow and A. Agrawal, Editors, p. 158.

X. Li, et al., "Gate-Controlled Punch Through Transistor," Department of Electrical Engineering, University of Idaho.

* cited by examiner

A

B

SEMICONDUCTOR DEVICES WITH NON-PUNCH-THROUGH SEMICONDUCTOR CHANNELS HAVING ENHANCED CONDUCTION AND METHODS OF MAKING

The section headings used herein are for organizational purposes only and should not be construed as limiting the subject matter described herein in any way.

BACKGROUND

1. Field

This application relates generally to semiconductor devices and to methods of making the devices.

2. Background of the Technology

In junction field-effect devices used in power switching applications, it is often highly desirable to not only reduce the channel resistance but also provide a MOSFET-like switching behavior. In particular, once the channel is pinched-off by the threshold voltage applied to the gate, it would be desirable if the device can block the maximum or rated voltage. Such device property requires infinitely high voltage blocking gain $\beta$. In junction field-effect devices, low channel resistance and high voltage blocking gain are typically viewed as competing device characteristics. For example, in short-channel JFETs or SITs, the channel component of the total device resistance is relatively small and current saturation is much less pronounced than in longer channel JFET structures. However, the voltage-blocking gain is also small and the difference between the threshold voltage and the gate bias required to block the maximum drain voltage is very significant, reaching in some cases tens of volts (e.g., Merrett et al. [1]). On the other hand, in long channel enhancement-mode JFETs that can provide high voltage-blocking gain, the current saturates too early to fully utilize relatively low on-state channel resistance in the linear region (e.g., Zhao et al. [2] and Sannuti et al. [3]). This problem is especially pronounced in the case of power SiC VJFETs. As a result, the development of normally-off switching devices has been impaired.

Accordingly, there still exists a need for junction field-effect semiconductor devices having low on-state channel resistance and high voltage-blocking gain.

SUMMARY

A semiconductor device is provided which comprises:

a substrate layer of a semiconductor material of a first conductivity type;

a first layer of a semiconductor material of the first conductivity type on the substrate layer;

a raised region of a semiconductor material of the first conductivity type on the first layer, the raised region comprising an upper surface and first and second tapered sidewalls;

semiconductor material of a second conductivity type different than the first conductivity type on the first and second sidewalls of the raised region and on the upper surface of the first layer adjacent to the raised region; and a third layer of a semiconductor material of the first conductivity type on the upper surface of the raised region;

wherein the raised region comprises a first portion with a first average dopant concentration adjacent the third layer and a second portion with a second average dopant concentration between the first portion and the first layer, wherein the first average dopant concentration is lower than the second average dopant concentration and wherein the second average dopant concentration is higher than the average dopant concentration of the first layer.

A circuit comprising one or more semiconductor devices as set forth above is also provided.

A method of making a semiconductor device is also provided which comprises:

selectively etching through a third layer of a semiconductor material of a first conductivity type, wherein the third layer is on a second layer of a semiconductor material of the first conductivity type and wherein the second layer is on a first layer of a semiconductor material of the first conductivity type and wherein the first layer is on a substrate layer of a semiconductor material of the first conductivity type, wherein selectively etching through the third layer comprises selectively etching into the underlying second layer to form a raised region of semiconductor material of the first conductivity type having an upper surface comprising semiconductor material of the third layer and tapered sidewalls comprising semiconductor material of the second layer;

selectively implanting dopants into the semiconductor material of the second layer on the sidewalls of the raised region to form regions of semiconductor material of a second conductivity type different than the first conductivity type on the sidewalls of the raised region and on the upper surface of the first layer adjacent to the raised region;

wherein the second layer comprises a first portion with a first average dopant concentration adjacent the third layer and a second portion with a second average dopant concentration between the first portion and the first layer, wherein the first average dopant concentration is lower than the second average dopant concentration and wherein the second average dopant concentration is higher than the average dopant concentration of the first layer.

These and other features of the present teachings are set forth herein.

BRIEF DESCRIPTION OF THE DRAWINGS

The skilled artisan will understand that the drawings, described below, are for illustration purposes only. The drawings are not intended to limit the scope of the present teachings in any way.

DESCRIPTION OF THE VARIOUS EMBODIMENTS

Figure 1:
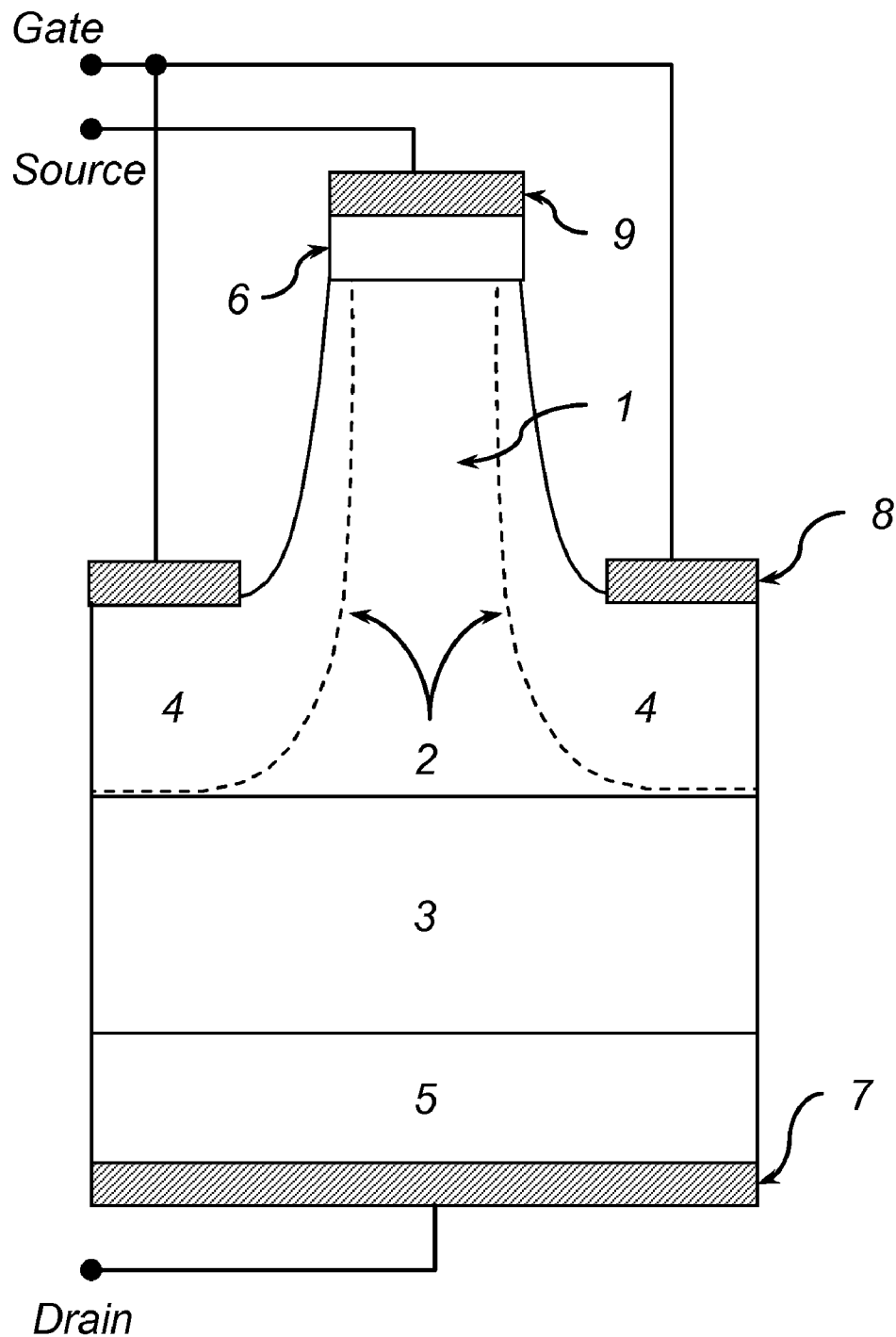
FIG. 1 is a schematic cross-section of a SiC VJFET structure with a non-punch through (NPT) channel having reduced resistance.

For the purposes of interpreting this specification, the use of "or" herein means "and/or" unless stated otherwise or where the use of "and/or" is clearly inappropriate. The use of "a" herein means "one or more" unless stated otherwise or where the use of "one or more" is clearly inappropriate. The use of "comprise," "comprises," "comprising," "include," "includes," and "including" are interchangeable and not intended to be limiting. Furthermore, where the description of one or more embodiments uses the term "comprising," those skilled in the art would understand that, in some specific instances, the embodiment or embodiments can be alternatively described using the language "consisting essentially of" and/or "consisting of." It should also be understood that in some embodiments the order of steps or order for performing certain actions is immaterial so long as the present teachings remain operable. Moreover, in some embodiments two or more steps or actions can be conducted simultaneously.

High channel resistance and low voltage-blocking gain have been treated in the past as separate problems. The channel resistance is a non-linear function of the biases applied to the channel terminals and to the rectifying junctions. Two regions can be conditionally distinguished in the I-V characteristics of the channel where the channel resistance is almost constant: the linear region and the saturation region. In the linear region, the channel resistance is proportional to the channel length and inversely proportional to the doping concentration and the cross-sectional area of the current pass. In the saturation region, the channel resistance grows drastically, making this region of little use in most power switching applications.

The mechanism of current saturation in junction field-effect transistors was disclosed in Shockley [4]. This effect can be described as follows. As the drain-source bias applied to a JFET structure increases at a fixed gate-source bias, the potential drop in the channel along the current flow causes the depletion region inside the channel to widen toward the drain. Because of this, the current path inside the channel becomes narrower toward the drain, causing the current to saturate. The mechanism described in Shockley later appeared to be even more severe due to saturation of carrier drift velocity at high electric fields. According to Ohm's law, as the channel resistivity increases toward the drain, the electric field also increases resulting in carrier mobility degradation, which causes a further increase in the channel resistivity and even faster saturation of the drain current.

Several approaches to solve the problem of early current saturation have been proposed. U.S. Pat. No. 2,984,752, for example, discloses a channel structure that reduces the effect of current saturation utilizing non-uniform spacing between alloyed p-n junctions. The distance between the junctions linearly increases toward the terminal with the higher bias resulting in the higher current that can be driven through the channel before its pinch-off by the merging space-charge regions. The device structure disclosed in U.S. Pat. No. 2,984,752 is extremely difficult to manufacture, however, due to the alloyed junctions.

The device disclosed in U.S. Pat. No. 2,984,752 is also not suitable for high-voltage applications because it does not have a voltage blocking layer (i.e., a drift region) between the channel and the drain. The resistance of a drift region could be minimized for the targeted breakdown voltage $V_b$ and maximum allowed plain-junction electric field $E_{1DMAX}$ by choosing the doping $N_{dr}$ and thickness $t_{dr}$ as set forth in the following equation:

$$t_{dr} = \frac{3}{2} \cdot \frac{V_b}{E_{1DMAX}} \quad (1)$$

$$N_{dr} = \frac{4}{9} \cdot \frac{\varepsilon_0 \cdot \varepsilon_r}{q} \cdot \frac{E_{1DMAX}^2}{V_b}.$$

A device having a vertical channel structure which is formed by plasma etching and confined by implanted rectifying junctions is disclosed in U.S. Pat. No. 4,403,396.

A vertical SiC JFET that has a drift region and wherein the saturation current is improved using non-uniform spacing between the junctions is disclosed in U.S. Pat. No. 5,747,831. Although this device can be more easily manufactured than the structure disclosed in U.S. Pat. No. 2,984,752, the vertical SiC JFET disclosed in U.S. Pat. No. 5,747,831 is not suited for high-voltage devices that exhibit MOSFET-like switching behavior (i.e., infinitely high blocking gain) as explained below.

Infinitely high blocking gain is represented by the equation:

$$\beta = \frac{dV_{DS}}{dV_{GS}} \to -\infty \text{ at } V_{GS} < V_{th}.$$

A hypothetical channel of length L where the current flows between the source (y=0) and the drain (y=L) entrances and is confined by rectifying junctions (e.g., p-n junctions) which are symmetrical with respect to the channel axis can be considered. If the doping concentration along the channel axis as defined by N(y) and a(y) represents the half-distance between the rectifying junctions, the pinch-off voltage can be defined along the channel axis as follows:

$$V_P(y) = \frac{q}{\varepsilon} N(y) \frac{a(y)^2}{2}, \; y \in [0, L]. \quad (2)$$

The following non-punch-through (NPT) conditions, where $V_{bi}(y)$ is built-in potential, and $E_m$ stands for the maximum electric field that occurs at the drain entrance of the channel when the maximum drain voltage ($V_{DS}=V_b$) is applied can then be set along the channel axis:

$$V_{punch\text{-}through}(y) - V_{th} + V_{bi}(y) \geq V_P(y), \; y \in [0, L] \quad (3)$$

$$E_{punch\text{-}through} = \frac{q}{\varepsilon} \int_0^L N(y) dy > E_m \quad (4)$$

In the case of a device structure having a drift region optimized for the lowest resistance, targeted breakdown voltage ($V_b$) and maximum allowed plain-junction electric field $E_{IDMAX}$ using equation (1), the conditions (3)-(4) can be rewritten as the following set of constraints:

$$\begin{cases} \frac{1}{t_{dr}} \int_0^L \int_0^y N(\xi) d\xi dy + \int_0^L N(y) dy > \frac{\varepsilon}{q} E_{1DMAX} \\ a(y) < \sqrt{2 \int_0^y \int_0^\lambda \frac{N(\xi)}{N(y)} d\xi d\lambda + \frac{2\varepsilon}{qN(y)}(V_{bi}(y) - V_{th})}, y \in [0, L] \end{cases} \quad (5)$$

For the case of uniform channel doping concentration, the set of constraints (5) can be simplified as follows:

$$\begin{cases} L > t_{dr}\left(\sqrt{\left(1 + \frac{3N_{dr}}{N_{ch}}\right)} - 1\right) \\ a(y) < \sqrt{y^2 + \frac{2\varepsilon}{qN_{ch}}(V_{bi} - V_{th})}, y \in [0, L] \end{cases} \quad (6)$$

Since the vertical SiC JFET disclosed in U.S. Pat. No. 5,747,831 has channel and drift regions with the same doping concentration ($N_{dr}=N_{ch}$), if the conditions (6) are satisfied, the channel length in this structure would exceed the drift region thickness ($L>t_{dr}$). This would be impractical for high-voltage devices that require relatively thick low doped drift regions.

A vertical SiC Static Induction Transistor (SIT) structure having higher doping concentrations in the channel layer than in the drift region is disclosed in U.S. Pat. No. 5,945,701.

A static induction transistor (SIT) structure where the channel consists of a layer with "low" impurity concentration separated from the source with a layer with "very low" impurity concentration is disclosed in U.S. Pat. No. 4,364,072.

U.S. Patent Application Publication No. 2007/0187715 A1 discloses a device having a uniformly doped channel structure that can provide non-punch-through performance. The structure disclosed in U.S. Patent Application Publication No. 2007/0187715 A1, however, also has certain limitations as explained in the following discussion.

The specific resistance of a drift region with optimal parameters from equation (1) can be derived as follows:

$$R_{drift\_opt} = \frac{27}{8} \cdot \frac{V_b^2}{\varepsilon_0 \cdot \varepsilon_r \cdot \mu \cdot E_{1DMAX}^3}. \quad (7)$$

As shown in (7), for a given blocking requirement, the specific resistance of the drift region is inversely proportional to the third power of the maximum one-dimensional electric field ($E_{IDMAX}$). In 4H—SiC the maximum electric field allowed in properly terminated abrupt junctions can exceed 2.4 MV/cm (Sankin et al., [5]). As a result, there is a strong motivation to use SiC in power devices in order to reduce on-state losses. However, when using SiC in junction field-effect devices with uniformly-doped non-punch-through channels, the channel dose $D_{ch}=N_{ch}L$ should be chosen much higher than for semiconductors with lower critical electric fields. In order to minimize the channel resistance, it is preferable to increase the channel dose by increasing its doping rather than its length. For a given threshold voltage, however, the higher the channel doping the smaller the distance between the rectifying junctions. In turn, this demands more costly lithography techniques, especially when a positive threshold voltage is required. In the case of implanted p-n junctions, shrinking down the channel thickness would cause lateral implantation profiles to merge at the channel axis resulting in the reduction in the net channel doping, and would also degrade the channel electron mobility due to the implantation damage propagating laterally from the sidewalls. These effects would result in increased channel resistance and early saturation of the channel current. Indeed, the I-V characteristics of the device disclosed in U.S. Patent Application Publication No. 2007/0187715 A1 exhibit very small saturation voltage ($V_{SAT}$<1 V at $V_{GS}$=2.5 V). As a result, it would be difficult to operate the device disclosed in U.S. Patent Application Publication No. 2007/0187715 A1 in unipolar mode where the gate-to-source bias should not exceed the built-in potential of the controlling p-n junction.

A device having different doping levels in the channel region and the drift region(s) is disclosed in U.S. Pat. No. 7,187,021.

An MOS transistor structure with a "non-uniform gate region" that consists of both enhancement and depletion regions is disclosed in Nagata et al [6].

Semiconductor devices are described wherein current flow in the device is confined between the rectifying junctions in the region of the device that is commonly referred to as a channel. The rectifying junctions can be, for example, p-n junctions or/and metal-semiconductor junctions. This semiconductor configuration provides non-punch-through behavior and enhanced current conduction capability. The devices can be power semiconductor devices as such as Junction Field-Effect Transistors (JFETs), Static Induction Transistors (SITs), Junction Field Effect Thyristors, JFET current limiters, etc. The devices can be made in wide bandgap semiconductors such as silicon carbide (SiC). According to some embodiments, the device can be a normally-off SiC vertical junction field effect transistor (i.e., a VJFET).

According to some embodiments, a device having a channel structure is described that provides a non-punch-through performance {e.g., which satisfies the conditions of equation (5)}. In particular, once the channel is pinched-off by the threshold voltage applied to the gate, the device can block the maximum voltage which is represented by the equation:

$$\beta = \frac{dV_{DS}}{dV_{GS}} \to -\infty \text{ at } V_{GS} < V_{th}.$$

The channel structure of the device can also provide dramatically reduced resistance and reduce or eliminate the problem of early current saturation. The device can fully utilize the breakdown strength of wide bandgap semiconductors in non-punch-through junction field-effect devices by eliminating the necessity of finding a trade-off between the channel and drift components of the device resistance.

According to some embodiments, the device has a vertical channel structure which is non-uniformly doped such that a portion of the channel located closer to the source has an average doping concentration which is lower than that of an underlying portion of the channel. The relatively short lower doped portion of the channel, or "VTH-control channel," can be pinched-off with a gate bias equal to the required threshold voltage without adding a significant component to the total device resistance. The dopant concentration in the heavier doped underlying portion of the channel, or the "field-stop channel", can be chosen at a level high enough to provide non-punch-through performance {e.g., to satisfy condition (4)}. Since the distance between the rectifying junctions in the heavier doped "field-stop channel" is larger or equal to that of the "VTH-control channel," its resistance can be even smaller.

It should be understood that the division between the "VTH-control channel" and "field-stop channel" of the device is conditional. The channel doping concentration N(y) and the distance between the rectifying junctions a(y) can satisfy the conditions (5), but the resulting pinch-off voltage $V_p(y)$ defined in equation (2) can be either a stepwise growing function or a strictly growing function.

Figure 2:
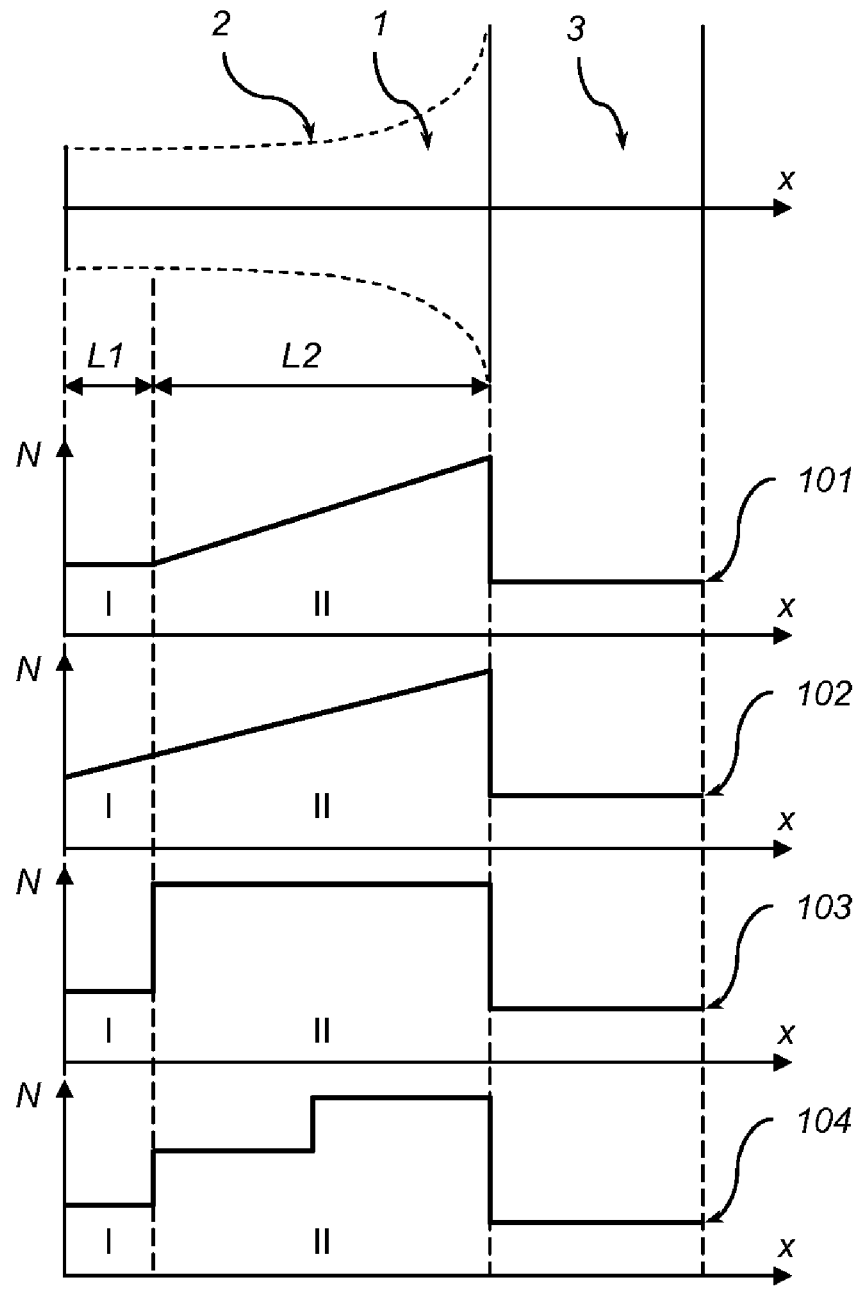
FIG. 2 is a schematic illustrating various exemplary doping profiles in a non-uniformly doped non-punch through (NPT) channel.

A schematic cross-section of an exemplary 4H—SiC VJFET structure with the non-uniformly doped non-punch-through channel is shown in FIG. 1. Exemplary channel doping profiles are shown in FIG. 2. In these figures, the reference numerals 1, 2, and 3 denote the channel region, rectifying junction, and drift region, respectively. The reference numerals 4, 5, and 6 in FIG. 1 correspond to the P+ gate regions, the N+ drain substrate, and the N+ source layer, respectively. The numerals 101, 102, 103, and 104 in FIG. 2 represent exemplary doping profiles in the channel and drift regions. Latin numerals I and II in FIG. 2 represent conditionally defined "VTH-control" and "field-stop" portions of the channel that have lengths L1 and L2, respectively.

The doping profiles shown in FIG. 2 are merely exemplary. Moreover, the doping distribution along the channel can be optimized to provide the highest voltage gain during turn-off while minimizing the channel resistance and the effect of the current saturation in the on-state. For example, the doping profile can be defined by a higher degree polynomial or by another analytical function.

As discussed above, the devices described herein have non-punch-through channels with significantly reduced resistance, which can be achieved by increasing the channel doping concentration while maintaining a sufficient distance between the rectifying junctions. This can result in more pronounced junction singularities at the channel entrances resulting in more significant field enhancement that ultimately lowers the maximum allowed 1-D electric field applied to the gate-drift junction. Moreover, when trying to increase the channel packing density by reducing the trench width, the radii of the gate junction "cylinders" can be reduced resulting in further field enhancement.

Figure 3A:
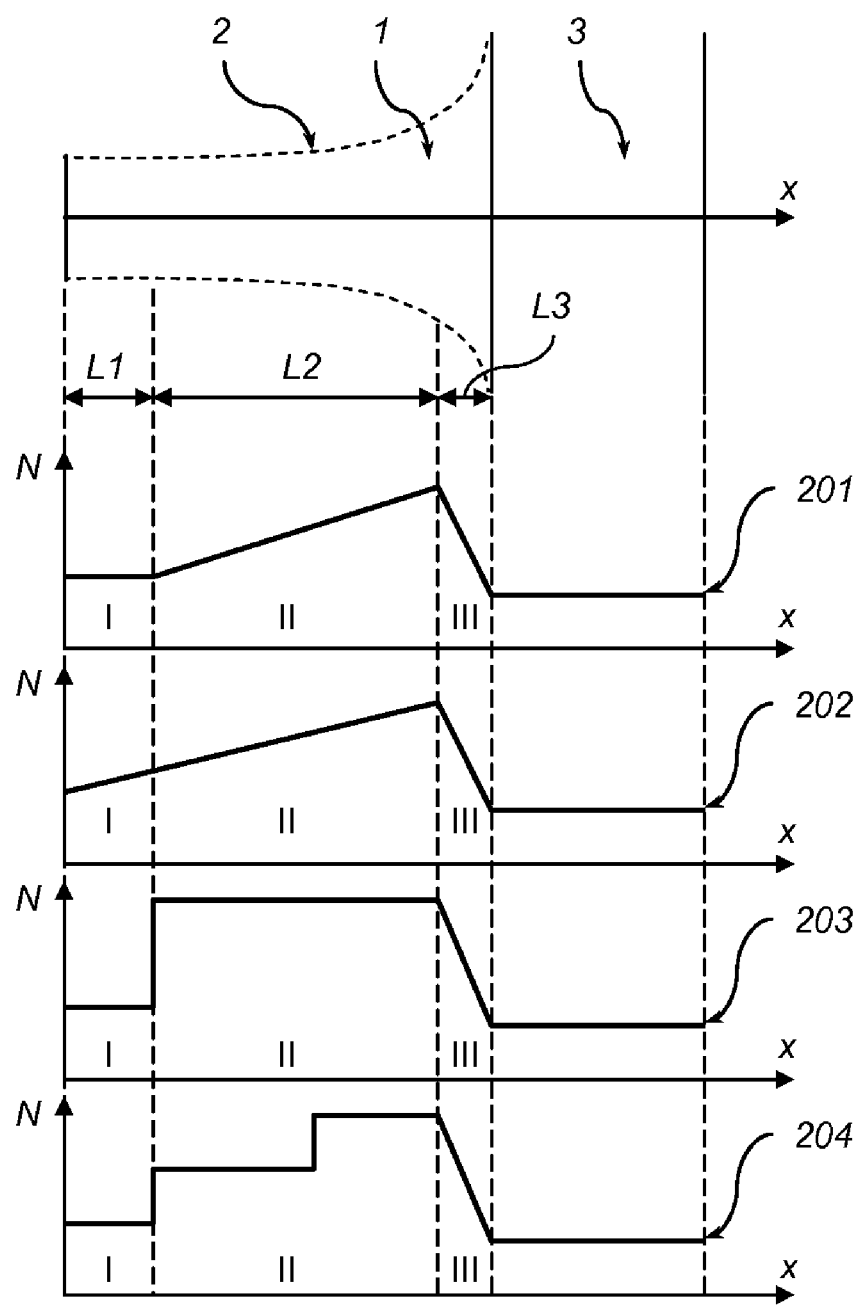
FIG. 3A is a schematic illustrating various exemplary doping profiles in a non-uniformly doped non-punch through (NPT) channel having a gradually doped field suppressing layer.
Figure 3B:
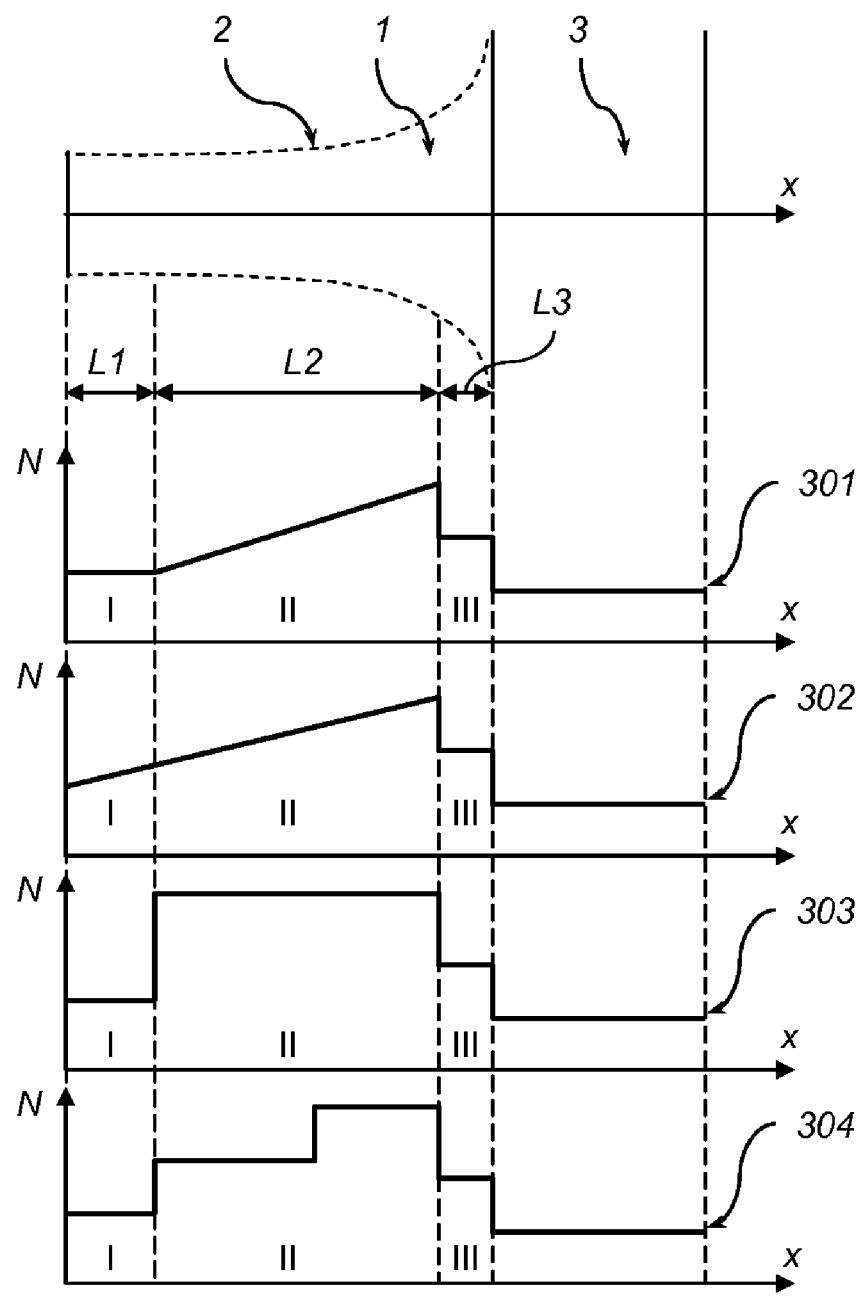
FIG. 3B is a schematic illustrating various exemplary doping profiles in a non-uniformly doped non-punch through (NPT) channel having a stepwise doped field suppressing layer.

In order to suppress the electric field enhancement at the rectifying junctions, a device having a relatively thin semiconductor layer located at the drain entrance of the channel between the higher doped "field-stop channel" and lower doped drift region is also provided. Exemplary doping profiles in a non-uniformly doped NPT channel having a gradually and stepwise doped field suppressing layer, or "field-smooth channel," are shown in FIGS. 3A and 3B, respectively. The reference numerals 201-204 and 301-304 in FIGS. 3A and 3B schematically represent exemplary doping profiles in the channel and drift regions in the case of gradually (FIG. 3A) and stepwise (FIG. 3B) doped "field-smooth channels." Latin numerals I, II, and III in these figures represent conditionally defined "VTH-control", "field-stop", and "field-smooth" portions of the channel that have lengths L1, L2, and L3, respectively. As in the previous embodiments, the doping concentration in the "field-smooth" portion of the channel can be defined by a higher degree polynomial or by another analytical function.

According to some embodiments, a device having a non-uniformly doped channel as described above is provided wherein the rectifying junctions confining the current flow are electrically coupled or biased independently or wherein at least one of the rectifying junctions is electrically coupled to one of the channel entrances.

A non-uniformly doped channel as described above can be used to control the current flow in field-effect semiconductor devices having a vertical channel structure including, but not limited to, Junction Field-Effect Transistors (JFETs), Static Induction Transistors (SITs), Junction Field Effect Thyristors, and JFET current limiters.

For example, the non-uniformly doped channel described above can be used to control the current flow in normally-off SiC Vertical Junction Field-Effect Transistors (VJFETs).

The average doping concentration calculated along the current flow path in the "VTH-control" portion of the channel may range from $1 \times 10^{16}$ cm$^{-3}$ to $1 \times 10^{17}$ cm$^{-3}$.

The average distance between the rectifying junctions in the "VTH-control" portion of the channel can be selected to provide a desired threshold voltage and may range from 0.3 μm to 1.7 μm.

The length of the "VTH-control" portion of the channel measured along the current flow path may vary from 0.25 μm to 1 μm.

The average doping concentration in the "field-stop" portion of the channel can be from $3 \times 10^{16}$ cm$^{-3}$ to $3 \times 10^{17}$ cm$^{-3}$.

The length of the "field-stop" portion of the channel measured along the current flow path may vary from 0.5 μm to 3 μm.

The length of the optional "field-smooth" portion of the channel measured along the current flow path may vary from 0.25 μm to 0.75 μm.

The average doping concentration of the optional "field-smooth" portion of the channel calculated along the current flow path may vary from $1 \times 10^{16}$ cm$^{-3}$ to $1 \times 10^{17}$ cm$^{-3}$.

According to some embodiments, the device has a channel with a punch-through electric field (i.e., the minimum electric field which, when applied to the channel, results in punch-through behavior) which is greater than 2.4 MV/cm. For example, the device can exhibit non-punch through behavior at an applied electric field of 2.4 MV/cm or less.

The device having a non-uniformly doped channel can be a normally-off junction field-effect transistors (JFET) made of a wide bandgap semiconductor (e.g., a semiconductor material having $E_G > 2$ eV) and having a vertical channel structure confined with either implanted or regrown p-n junctions, or by rectifying Schottky contacts. This non-uniformly doped channel can also be used in the design and fabrication of other wide bandgap semiconductor devices having a vertical channel structure. Examples of such devices include, but are not limited to, Junction Field-Effect Transistors (JFETs), Static Induction Transistors (SITs), Junction Field Effect Thyristors, and JFET current limiters.

Moreover, the device can be any semiconductor device having a vertical channel structure where the current flow is confined by the rectifying junctions. Examples of such devices include, but are not limited to: junction field-effect transistors and thyristors where the current flow occurs through a lateral channel connected in series with a vertical channel; Metal Oxide Semiconductor Field Effect Transistors (MOSFETs) where the current flow occurs through a MOS channel connected in series with a vertical channel confined with the p-n junctions; and Junction Barrier Schottky (JBS) diodes, where the current flow occurs through the channel confined with the p-n junctions.

As set forth above, the semiconductor devices can be made in a wide band gap semiconductor material such as SiC. The SiC can be 4H—SiC. Other polytypes of SiC (e.g., 6H—SiC, 3C—SiC, or 15R—SiC) or other wide bandgap semiconductor materials such as Group III nitride compound semiconductors (e.g., gallium nitride GaN), however, can also be used.

The non-uniformly doped channel structure described herein can provide non-punch-through behavior with minimum resistance for a given threshold voltage. The non-uniform doping concentration in the channel region can be achieved using epitaxial growth. For example, by using epitaxial reactors that allow specifying gas flow as analytical functions of time (e.g., see Reference [7]). Alternatively, the non-uniform doping concentration in the channel region can be achieved via multi-dose ion implantation.

Although modern commercial epitaxial reactors allow specifying gas flow as analytical functions of time (e.g., see Reference [7]) to define non-uniform doping concentrations, the resulting doping profiles can differ from those expected. Because the required doping concentration incorporated into the grown "field-stop" and "VTH-control" layers may decrease with time during the epitaxial run, a so-called memory effect may result in unintentional doping in addition to the analytically specified doping concentration. The "memory effect" can be caused by the dopant species being absorbed by internal surfaces of the epitaxial reactor in the early stages of epitaxial growth. The effect can be compensated for by adding correction terms to the analytical formulas that define the gas flow.

In the case of using ion-implantation to form non-uniform doping profiles, such profiles would experience the "valleys" between the concentration peaks corresponding to implantation energies. In order to minimize the influence of such "valleys" between the concentration peaks, the implantation schedule (i.e., energies and doses) can be carefully designed.

Zero-degree ion implantation can be used to form the rectifying junctions. The use of zero-degree ion implantation can significantly reduce the amount of implantation damage propagating to the channel laterally thereby significantly reducing the effect of the current saturation (more than an order of magnitude higher saturation current density at $V_{GS}$=2.5 V). According to some embodiments, the ion implantation can be conducted at an angle within +/−2 degrees of perpendicular to the substrate. According to some embodiments, the ion implantation can be conducted at an angle within +/−1 degree of perpendicular to the substrate.

Figure 4:
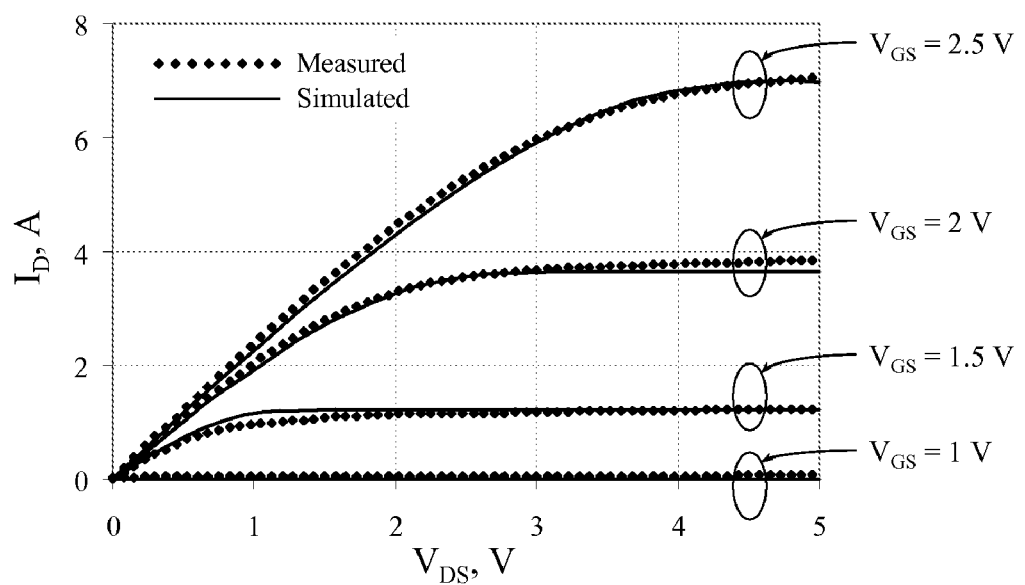
FIG. 4 is a graph showing overlaid measured and simulated I-V characteristics of a 1 mm$^2$ normally-off 1500 V 4H—SiC VJFET device with a channel having uniform doping concentration of $5 \times 10^{16}$ cm$^{-3}$ and rectifying junctions formed using zero-degree ion-implantation.

FIG. 4 shows overlaid measured and simulated I-V characteristics of a 1 mm² normally-off 1500 V 4H—SiC VJFET with a channel having uniform doping concentration of $5\times10^{16}$ cm⁻³ and rectifying junctions formed using zero-degree ion-implantation.

Figure 5:
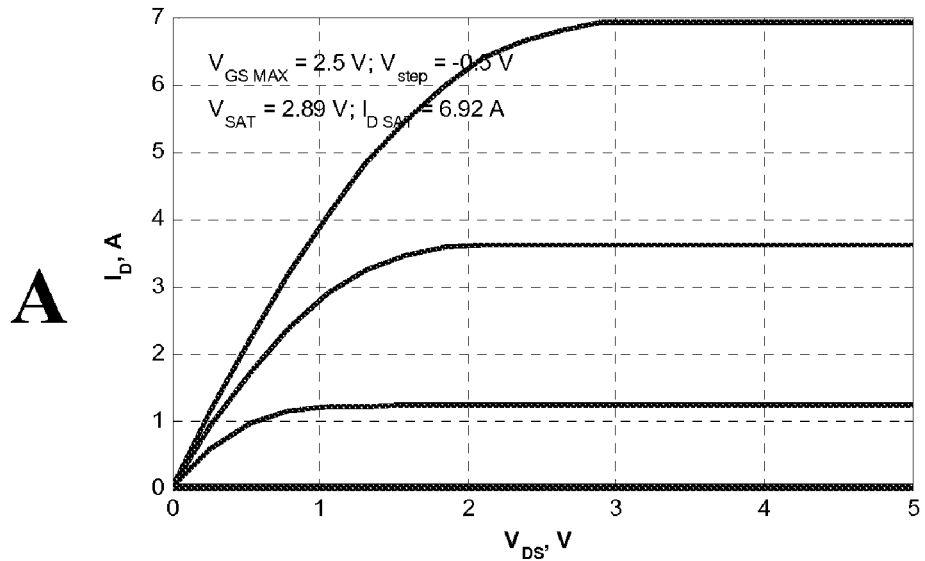
FIG. 5A is a graph showing simulated I-V characteristics for a 1 mm$^2$ normally-off 800 V SiC VJFET with rectifying junctions formed using zero-degree ion-implantation having uniform channel doping.
FIG. 5B is a pie chart showing the components of the total resistance for a 1 mm$^2$ normally-off 800 V SiC VJFET with rectifying junctions formed using zero-degree ion-implantation having uniform channel doping.
Figure 5:
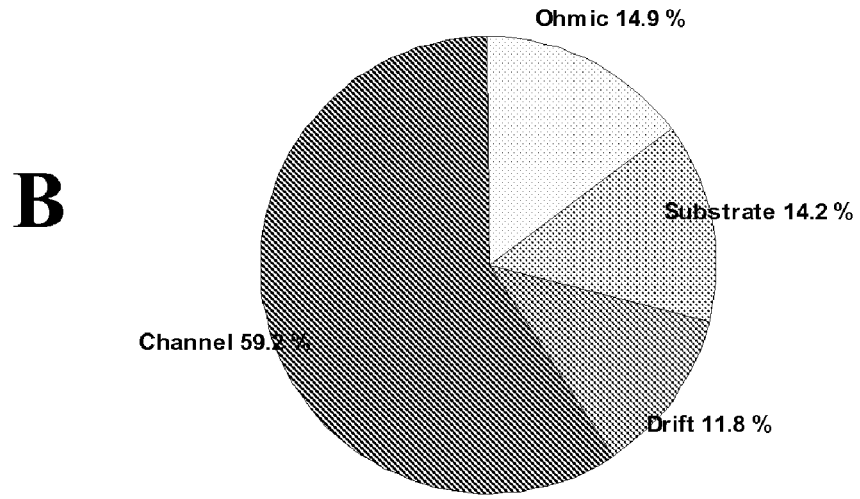

FIG. 5A is a graph showing simulated I-V characteristics for a 1 mm² normally-off 800 V SiC VJFET with rectifying junctions formed using zero-degree ion-implantation having uniform channel doping. FIG. 5B is a pie chart showing the components of the total resistance for a 1 mm² normally-off 800 V SiC VJFET with rectifying junctions formed using zero-degree ion-implantation having uniform channel doping.

Figure 6:
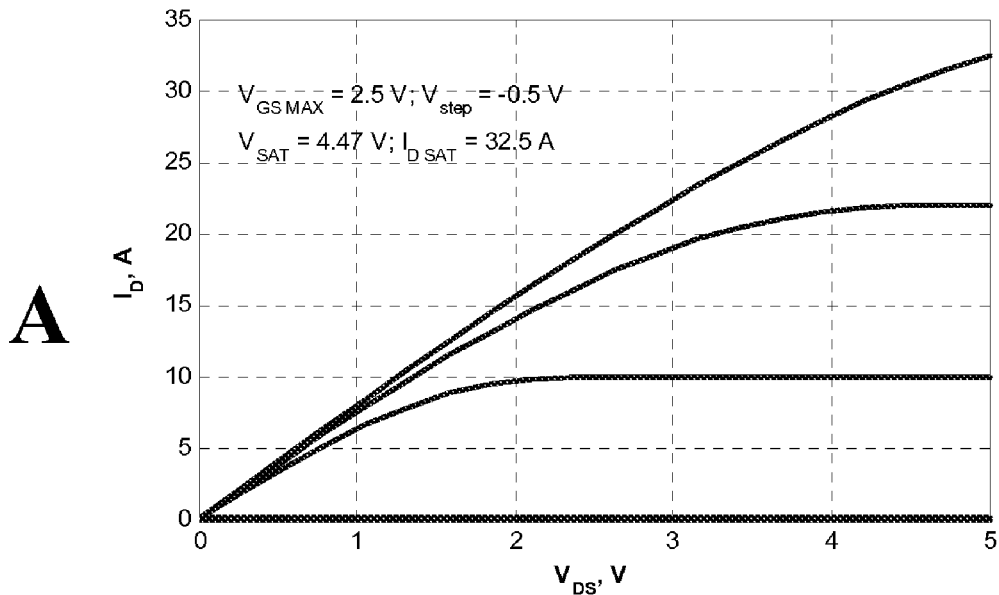
FIG. 6A is a graph showing simulated I-V characteristics for a 1 mm² normally-off 800 V SiC VJFET with rectifying junctions formed using zero-degree ion-implantation having non-uniform channel doping.
FIG. 6B is a pie chart showing the components of the total resistance for a 1 mm² normally-off 800 V SiC VJFET with rectifying junctions formed using zero-degree ion-implantation having non-uniform channel doping.
Figure 6:
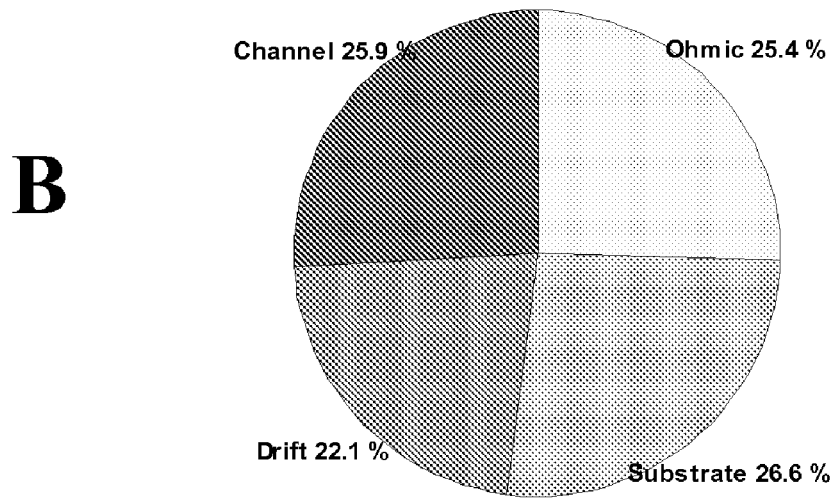

FIG. 6A is a graph showing simulated I-V characteristics for a 1 mm² normally-off 800 V SiC VJFET with rectifying junctions formed using zero-degree ion-implantation having non-uniform channel doping. FIG. 6B is a pie chart showing the components of the total resistance for a 1 mm² normally-off 800 V SiC VJFET with rectifying junctions formed using zero-degree ion-implantation having non-uniform channel doping.

The drift parameters in both devices were calculated using equation (1) for the $E_{IDMAX}$ and $V_b$ equal to 2.3 Mv/cm and 800 V, respectively.

While the foregoing specification teaches the principles of the present invention, with examples provided for the purpose of illustration, it will be appreciated by one skilled in the art from reading this disclosure that various changes in form and detail can be made without departing from the true scope of the invention.

REFERENCES

[1] J. N. Merrett, I. Sankin, V. Bonderenko, C. E. Smith, D. Kajfez, and J. R. B. Casady, "RF and DC Characterization of Self-aligned L-band 4H—SiC Static Induction Transistors," *Materials Science Forum* Vols. 527-529 (2006) pp. 1223-1226.

[2] J. H. Zhao, K. Tone, X. Li, P. Alexandrov, L. Fursin and M. Weiner, "3.6 mΩ·cm², 1726V 4H—SiC normally-off trenched-and-implanted vertical JFETs and circuit applications," *IEE Proc.-Circuits Devices Syst.*, Vol. 151, No. 3, June 2004.

[3] P. Sannuti, X. Li, F. Yan, K. Sheng, J. H. Zhao, "Channel electron mobility in 4H—SiC lateral junction field effect transistors," *Solid-State Electronics* 49 (2005) 1900-1904

[4] W. Shockley, "A Unipolar "Field-Effect" Transistor," *Proceedings of the IRE* Volume 40, Issue 11, November 1952, pp.: 1365-1376.

[5] I. Sankin, "Edge termination and RESURF technology in power silicon carbide devices," *Ph.D. Dissertation*, Mississippi State University, 2006; AAT 3213969, p. 110.

[6] M. Nagata, T. Masuhara, N. Hashimoto, H. Masuda, "A short-channel, punch-through-breakdown-free MOS transistor," International Electron Devices Meeting, 1971 Volume 17, 1971 Page(s): 2-3.

[7] Legacy CACE User's Guide AixRecipe; Recipe Language for AIXTRON systems, Copyright 1994-2004, AIXTRON AG, Kaskertstrasse 15-17 D-52072 Aashen, Germany.

What is claimed is:

1. A semiconductor device comprising:
   a substrate layer of a semiconductor material of a first conductivity type;
   a first layer of a semiconductor material of the first conductivity type on the substrate layer;
   a raised region of a semiconductor material of the first conductivity type on the first layer, the raised region comprising an upper surface and first and second sidewalls, wherein the first and second sidewalls are tapered such that the raised region is narrower near the upper surface than adjacent the first layer;
   semiconductor material of a second conductivity type different than the first conductivity type on the first and second sidewalls of the raised region and on the upper surface of the first layer adjacent to the raised region; and
   a third layer of a semiconductor material of the first conductivity type on the upper surface of the raised region;
   wherein the raised region comprises a first portion with a first average dopant concentration of dopants of the first conductivity type adjacent the third layer and a second portion with a second average dopant concentration of dopants of the first conductivity type between the first portion and the first layer, wherein the first average dopant concentration is lower than the second average dopant concentration and wherein the second average dopant concentration is higher than the average dopant concentration of the first layer.

2. The device of claim 1, wherein the raised region further comprises a third portion with a third average dopant concentration between the first layer and the second portion of the raised region, wherein the third average dopant concentration is higher than the average dopant concentration of the first layer and wherein the third average dopant concentration is lower than the second average dopant concentration.

3. The device of claim 2, wherein the third portion of the raised region has a thickness of 0.25 to 0.75 μm in a direction perpendicular to the upper surface of the raised region.

4. The device of claim 2, wherein the dopant concentration in the third portion of the raised region is non-uniform in a direction perpendicular to the upper surface of the raised region and wherein the dopant concentration in the third portion of the raised region adjacent the second portion of the raised region is higher than the dopant concentration in the third portion of the raised region adjacent the first layer.

5. The device of claim 2, wherein the third average dopant concentration is $1 \times 10^{16}$ cm$^{-3}$ to $1 \times 10^{17}$ cm$^{-3}$.

6. The device of claim 1, wherein the semiconductor material of the first conductivity type is an n-type semiconductor material and wherein the semiconductor material of the second type is a p-type semiconductor material.

7. The device of claim 1, wherein the semiconductor material is a wide band-gap semiconductor material.

8. The device of claim 1, wherein the semiconductor material is SiC.

9. The device of claim 1, wherein the average width of the first portion of the raised region is 0.3 to 1.7 μm in a direction parallel to the upper surface of the raised region.

10. The device of claim 1, wherein the first portion of the raised region has a thickness of 0.25 to 1 μm in a direction perpendicular to the upper surface of the raised region.

11. The device of claim 1, wherein the first average dopant concentration is $1 \times 10^{16}$ cm$^{-3}$ to $1 \times 10^{17}$ cm$^{-3}$.

12. The device of claim 1, wherein the second average dopant concentration is $3 \times 10^{16}$ cm$^{-3}$ to $3 \times 10^{17}$ cm$^{-3}$.

13. The device of claim 1, wherein the second portion of the raised region has a thickness in a direction perpendicular to the upper surface of the raised region of 0.5 to 3 μm.

14. The device of claim 1, wherein the dopant concentration in the first portion of the raised region is uniform and wherein the dopant concentration in the second portion of the raised region varies in a stepped relationship in a direction perpendicular to the upper surface of the raised region.

15. The device of claim 1, wherein the dopant concentration in the first portion of the raised region is uniform and wherein the dopant concentration in the second portion of the raised region varies in a linear relationship in a direction perpendicular to the upper surface of the raised region.

16. The device of claim 1, wherein the dopant concentration in the first and second portions of the raised region varies in a linear relationship in a direction perpendicular to the upper surface of the raised region.

17. The device of claim 1, wherein the device is a Junction Field-Effect Transistor (JFET), a Static Induction Transistor (SIT), a Junction Field Effect Thyristor, or a JFET current limiter.

18. The device of claim 1, wherein the device exhibits non-punch through behavior at an applied electric field of 2.4 MV/cm or less.

19. The device of claim 1, further comprising:
a first gate contact on the semiconductor material of the second conductivity type on the first sidewall of the raised region and on the upper surface of the first layer adjacent to the first sidewall;
a second gate contact on the semiconductor material of the second conductivity type on the second sidewall of the raised region and on the upper surface of the first layer adjacent to the second sidewall;
a source contact on the third layer; and
a drain contact on the substrate layer opposite the first layer.

20. A circuit comprising the semiconductor device of claim 19.

21. The circuit of claim 20, wherein the first and second gate contacts are electrically coupled.

22. The circuit of claim 20, wherein the first and second gate contacts are not electrically coupled.

23. A circuit comprising first and second semiconductor devices as set forth in claim 19, wherein the source contact of the first device is electrically coupled to a gate contact of the second device.

24. The circuit of claim 20, wherein the circuit is an integrated circuit.

* * * * *